(12) United States Patent
No et al.

(10) Patent No.: US 7,546,941 B2
(45) Date of Patent: Jun. 16, 2009

(54) BALL ATTACHING APPARATUS FOR CORRECTING WARPAGE OF SUBSTRATE AND METHOD OF ATTACHING SOLDER BALLS USING THE SAME

(75) Inventors: Hai Ju No, Chungcheongbuk-do (KR); Hee Sung Kim, Chungcheongbuk-do (KR); Jung Bum Woo, Chungcheongbuk-do (KR); Sang Nam Go, Chungcheongbuk-do (KR); Tae Hyung Kim, Chungcheongbuk-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 151 days.

(21) Appl. No.: 11/746,686

(22) Filed: May 10, 2007

(65) Prior Publication Data

US 2008/0222888 A1   Sep. 18, 2008

(30) Foreign Application Priority Data

Mar. 15, 2007   (KR) ...................... 10-2007-0025740

(51) Int. Cl.
*B23K 20/08* (2006.01)
(52) U.S. Cl. .............................. 228/41; 228/33; 228/45; 228/180.22; 228/245; 228/246; 438/613; 438/614; 257/737; 257/738
(58) Field of Classification Search .................. 228/41, 228/180.22, 33, 245, 246, 45; 438/613, 614; 257/737, 738
See application file for complete search history.

(56) References Cited

U.S. PATENT DOCUMENTS 6,068,175 A * 5/2000 Heim et al. ................... 228/45

FOREIGN PATENT DOCUMENTS

| KR | 19990003763 | 1/1999 |
| KR | 1020020075521 | 10/2002 |
| KR | 1020040092064 | 11/2004 |
| KR | 1020050011421 | 1/2005 |
| KR | 1020050012585 | 2/2005 |

OTHER PUBLICATIONS

Korean Notice of Patent Grant dated Feb. 27, 2008 for the corresponding application KR 10-2007-0025740.

* cited by examiner

*Primary Examiner*—Barbara L Gilliam
*Assistant Examiner*—Eli Mekhlin
(74) *Attorney, Agent, or Firm*—Ladas & Parry LLP

(57) ABSTRACT

A ball attaching apparatus for respectively attaching solder balls onto a plurality of ball lands of a material which has mold caps formed between the ball lands. The apparatus includes an indexer on which the material is seated and fixed; a holder located above the indexer such that it can be raised and lowered; an attachment plate installed on a lower surface of the holder, having projections at positions corresponding to the mold caps of the material, and defined with grooves at positions corresponding to the ball lands of the material, in which the solder balls are placed; and eject pins arranged in the respective grooves of the attachment plate for conveying and dropping the solder balls through introduction and removal of vacuum.

22 Claims, 4 Drawing Sheets

BALL ATTACHING APPARATUS FOR CORRECTING WARPAGE OF SUBSTRATE AND METHOD OF ATTACHING SOLDER BALLS USING THE SAME

CROSS-REFERENCE TO RELATED APPLICATIONS

The present application claims priority to Korean patent application number 10-2007-0025740 filed on Mar. 15, 2007, which is incorporated herein by reference in its entirety.

BACKGROUND OF THE INVENTION

The present invention relates to a ball attaching apparatus and a method of attaching solder balls using the same, and more particularly to a ball attaching apparatus which can precisely attach solder balls to respective ball lands of a substrate even though warpage occurs in the substrate, and a method for attaching solder balls using the same.

Two key areas of semiconductor package development are miniaturization and improved electrical characteristics. A ball grid array (BGA) package is one such semiconductor package generally regarded as being capable of meeting the requirements.

The size of the entire BGA package is about the same or comparable to that of a semiconductor chip such that the mounting area of a BGA package can be minimized. A BGA package is electrically connected to the external circuits by solder balls, and this leads to improved electrical characteristics as the electric signal transmission paths of the solder balls are short.

The semiconductor chips of recent design are characterized with more miniaturization and higher functionality with more signal input and output pads. To meet this requirement, the BGA packages are manufactured as FBGA (fine pitch BGA) packages.

FIG. 1 shows a cross-sectional view of a conventional FBGA package.

Referring to FIG. 1, a semiconductor chip 100 is attached by an adhesive 109 to a substrate 102, which has a cavity 107 at a center portion thereof. The bonding pads 101 of the semiconductor chip 100 are electrically connected with the electrode terminals 103 of the substrate 102 by metal wires 106, which pass through the cavity 107. The upper surface of the substrate 102 including the semiconductor chip 100, the cavity 107 including the metal wires 106 in the cavity 107 are molded using a molding material 108. Solder balls 105 for mounting the FBGA package of FIG. 1 to external circuits are attached to the ball lands 104 provided on the lower surface of the substrate 102.

The solder ball attaching process is implemented using a ball attaching apparatus by vacuum-sucking the molten solder through the eject pins of the ball attaching apparatus, positioning the eject pins on the ball lands 104, and then dropping solder balls 105 on the ball lands 104 by removing the vacuum in the eject pins.

On the other hand, the substrate warpage could occur in the course of assembling a semiconductor package. Any warped substrate would cause irregular variations in the intervals between the balls lands leading to misalignment of the eject pins for dropping the solder balls and the ball lands to which the solder balls are to be dropped, as such solder balls cannot be precisely attached onto the ball lands formed on a warped substrate.

FIG. 2 shows the types of warpage occurring in a substrate, and FIG. 3 is shows the problematic attachment patterns of solder balls due to warpage of a substrate.

Referring to FIG. 2, the substrates could be warped during assembly of a semiconductor package into different shapes of a "smiling" type, a "crying" type, a "gull" type, and an "inversed gull" type. These types of warpage produce intolerant variations in the gaps between the ball attaching apparatus and the ball lands provided on the warped substrate such that a uniform distance between ejector pins and the balls lands cannot be maintained. The gaps between the ball attaching apparatus and the ball lands provided on the warped substrate could vary from a small value less than 300 μm to a large value greater than 900 μm.

Accordingly, due to misalignment of the ball attaching apparatus and the ball lands on a warped substrate, a solder ball could miss a ball land or an extra solder ball could be attached to a ball land or a solder ball could be miss-positioned on a ball land due to the fact that the solder balls are not precisely dropped onto the ball lands formed on a warped substrate during a solder ball attaching process.

For example, now referring to FIG. 3, the solder balls used in a BGA package may have a height of 400~450 μm, and the warpage of a substrate occurs in the smiling type. In this example, the gap between a set of eject pins and the ball lands near an edge of the warped substrate could be less than 300 μm, as such it would be impossible to secure the sufficient gap required for proper attachment of the solder balls.

As the solder balls are pressed by eject pins during a ball attaching process (due to the insufficient gaps as explained above), the eject pins may not drop the solder balls on the intended ball lands but instead carry away the solder balls to a different location causing the "missed ball" phenomenon and the "extra ball" phenomenon as shown in FIG. 3.

Toward the center portion of the substrate warped in a "smiling" type, the gap between eject pins and the ball lands may be greater than 900 μm, which is at least two times larger than the height of solder balls. This will lead to the "mispositioned ball" phenomenon (see FIG. 3), in which the solder balls are amispositioned on the ball lands when attaching the solder balls.

The variations in the gap between the ball attaching apparatus and the ball lands on a warped substrate cannot ensure proper attachment of solder balls on the ball lands such that it will cause defects and lower the productivity yield.

SUMMARY OF THE INVENTION

An embodiment of the present invention is directed to a ball attaching apparatus which can precisely attach solder balls to respective ball lands of a substrate regardless of warpage occuring in the substrate and a method for attaching solder balls using the same.

In one embodiment, a ball attaching apparatus for respectively attaching solder balls onto a plurality of ball lands of a material which has mold caps formed between the ball lands comprises an indexer on which the material is seated and fixed; a holder located above the indexer such that it can be raised and lowered; an attachment plate installed on a lower surface of the holder, having projections at positions corresponding to the mold caps of the material, and defined with grooves at positions corresponding to the ball lands of the material, in which the solder balls are placed; and eject pins arranged in the respective grooves of the attachment plate for conveying and dropping the solder balls through introduction and removal of vacuum.

The holder and the attachment plate further includes a tensioning part which has a dial gauge for constantly maintaining tension between the mold caps of the material and the projections of the attachment plate.

A lower end of the eject pin is positioned higher than a lower surface of the attachment plate.

The lower end of the eject pin is positioned higher than the lower surface of the attachment plate by 0.1~0.2 mm.

The projection has a height which is determined such that a summed height of the projection and the mold cap formed on the material permits a distance of 0.02~0.03 mm between an upper end of the solder ball to be attached and the eject pin.

The projection has a height which is proportional to that of the solder ball which is attached such that a distance between an upper end of the solder ball and the eject pin is 0.02-0.03 mm.

The groove has a width which is greater than that of the solder ball to be attached.

The material comprises a substrate.

The indexer has material fixing unit for fixing the material using vacuum.

The holder has a stopper for adjusting a height of the holder.

The holder further has a driving unit for controlling raising and lowering of the holder.

In another embodiment, there is provided a method for attaching solder balls using a ball attaching apparatus including an indexer on which a material is seated and fixed, a holder located above the indexer such that it can be raised and lowered, an attachment plate installed on a lower surface of the holder, having projections at positions corresponding to mold caps of the material, and defined with grooves at positions corresponding to a plurality of ball lands of the material, in which the solder balls are placed, and eject pins arranged in the respective grooves of the attachment plate for conveying and dropping the solder balls through introduction and removal of vacuum, the method comprising the steps of seating and fixing the material which has the plurality of ball lands and is formed with the mold caps between the ball lands, on the indexer; bringing the projections formed on the attachment plate into contact with the respective mold caps of the material by lowering the holder and then pressing the mold caps to correct warpage of the material; and attaching the solder balls onto the ball lands provided to the material by removing vacuum in the eject pins.

In the step of bringing the attachment plate into contact with the mold caps of the material, a gap between the eject pin and the material is constantly maintained by a pressure applied to the mold caps by a tensioning part which includes the attachment plate and a dial gauge disposed in the holder.

A lower end of the eject pin is positioned higher than a lower surface of the attachment plate.

The lower end of the eject pin is positioned higher than the lower surface of the attachment plate by 0.1~0.2 mm.

The projection has a height which is determined such that a summed height of the projection and the mold cap formed on the material permits a distance of 0.02~0.03 mm between an upper end of the solder ball to be attached and the eject pin.

The projection has a height which is proportional to that of the solder ball which is attached such that a distance between an upper end of the solder ball and the eject pin is 0.02~0.03 mm.

The groove has a width which is greater than that of the solder ball to be attached.

The material comprises a substrate.

The indexer has material fixing unit for fixing the material using vacuum.

The holder has a stopper for adjusting a height of the holder.

The holder further has a driving unit for controlling raising and lowering of the holder.

DESCRIPTION OF SPECIFIC EMBODIMENTS

In response to the warpage caused in a material during a manufacturing process of a semiconductor device, a ball attaching apparatus according to an embodiment of the present invention employs, inter alia, projections to press the warped material with predetermined tensioning force to even out the warped material and then attaching the solder balls to the ball lands.

Figure 1:
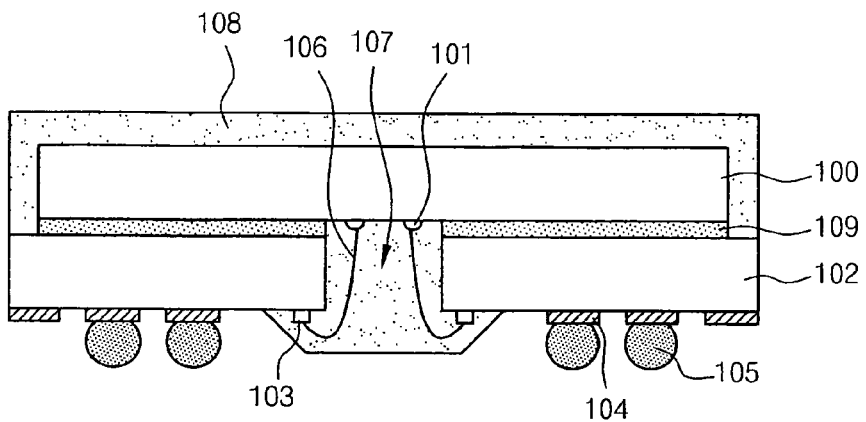
FIG. 1 is a cross-sectional view illustrating a conventional FBGA package.
Figure 2:
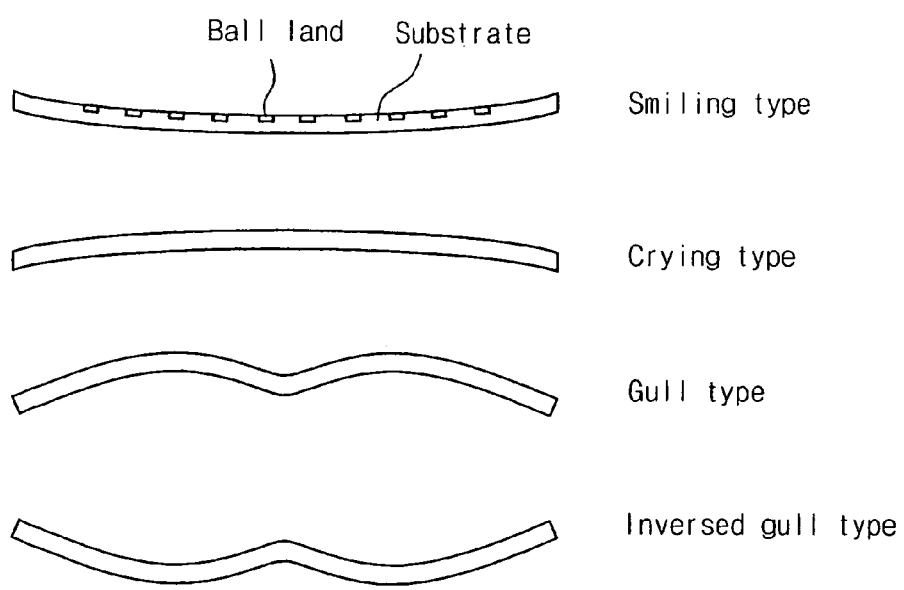
FIG. 2 shows the types of substrate warpage.
Figure 3:
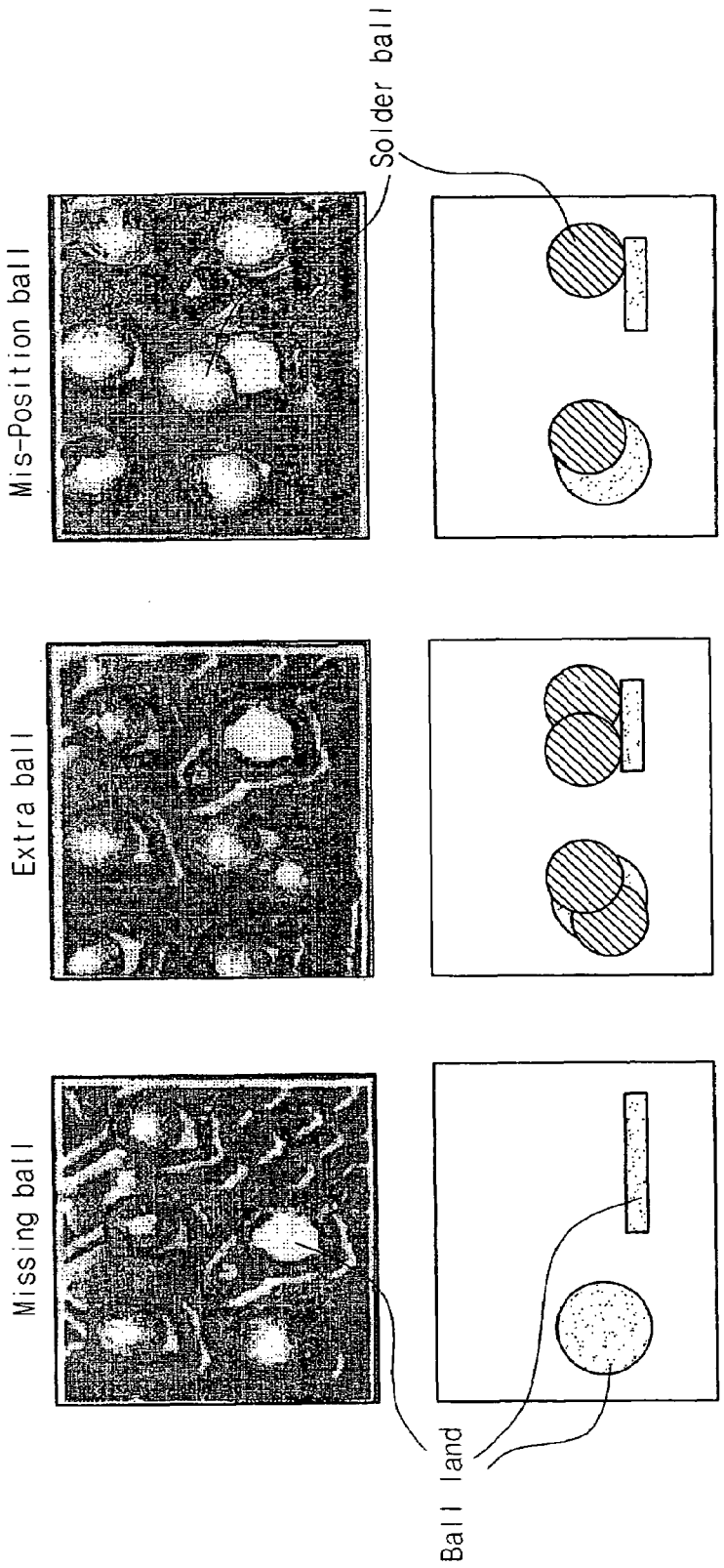
FIG. 3 shows improper solder ball attachment patterns due to warpage of a substrate.

As a consequence, solder balls are attached precisely to the ball lands of a material without the "missed ball" or "extra ball" or "mis-positioned ball" phenomenon (as shown in FIG. 2). Consequently, the reliability of the semiconductor packages is improved by the present invention.

As the precise attachment of the solder balls to the ball lands of the material are achieved by the present invention, at least 95% of the temporary interruptions triggered by a quality control inspector inspecting for improper solder ball attachments due to the substrate warpage are eliminated. The present invention also simplifies the FBGA package manufacturing process since the step of passing an FBGA package through an external visual inspection (EVI) equipment for inspecting the proper attachment of solder balls becomes unnecessary.

Hereafter, a ball attaching apparatus in accordance with an embodiment of the present invention will be described with reference to FIGS. 3 through 6.

Figure 4:
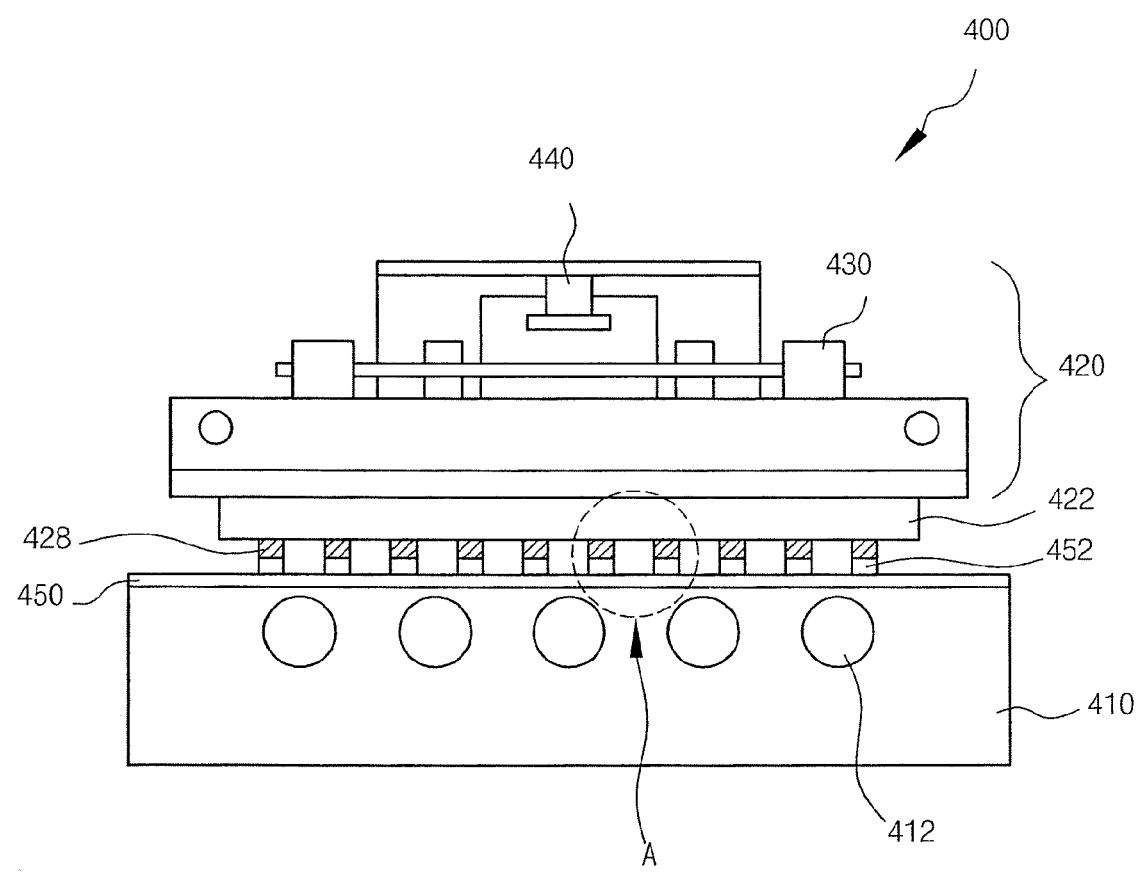
FIG. 4 is a view illustrating a ball attaching apparatus in accordance with an embodiment of the present invention.
Figure 5:
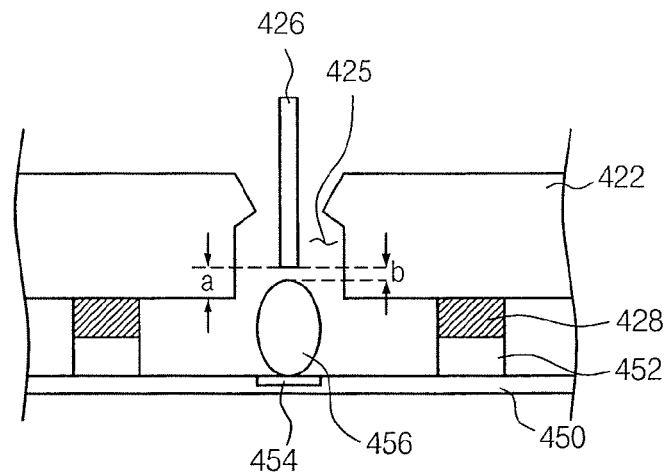
FIG. 5 is an enlarged view for the part 'A' of FIG. 4.
Figure 6:
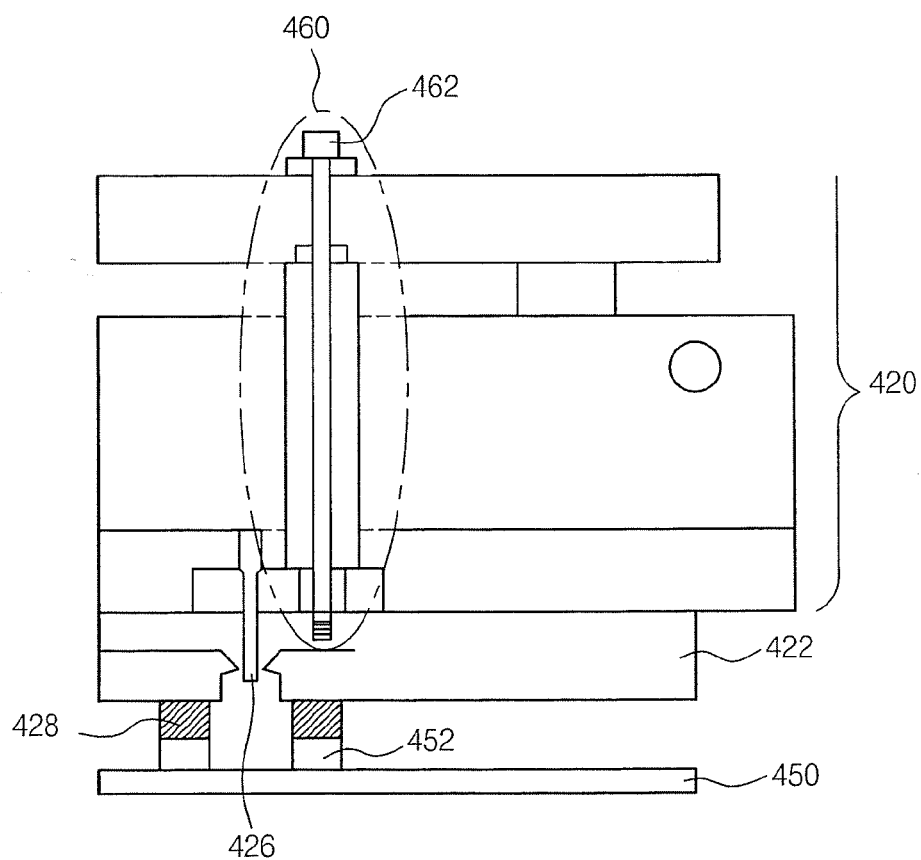
FIG. 6 is a view illustrating a tensioning part provided to the ball attaching apparatus in accordance with the embodiment of the present invention.

FIG. 4 is a view showing a ball attaching apparatus in accordance with an embodiment of the present invention; FIG. 5 is an enlarged view for the part 'A' of FIG. 4; and FIG. 6 is a view illustrating a tensioning part provided to the ball attaching apparatus in accordance with the embodiment of the present invention.

Referring to FIGS. 4 and 5, a ball attaching apparatus 400 in accordance with an embodiment of the present invention includes an indexer 410 on which a material 450 is seated, a movable holder 420 which is raised and lowered for attachment of solder balls 456, an attachment plate 422 which is attached to the lower surface of the holder 420, and eject pins 426 which convey the solder balls 456.

The material 450 can be understood as a substrate having a plurality of ball lands 454 and mold caps 452. The indexer 410 has a material fixing unit 412 for securely holding the material 450 on the indexer 410 using vacuum.

The holder 420 includes stoppers 430 which are positioned adjacent the edges of the upper surface of the holder 420 to adjust the heightwise position of the holder 420, and a driving unit 440 which is disposed on the center portion of the upper surface of the holder 420 to control raising and lowering of the holder 420. The driving unit 440 is also composed of a driving cylinder (not shown) and a driving circuit (not shown).

The attachment plate 422 has grooves 425 and projections 428. The grooves 425 are defined on the lower surface of the attachment plate 422 at positions, which correspond to the ball lands 454 of the material 450. The grooves are formed with an opening on the upper surface of the attachment plate 422 so that the elector pins 426 are disposed in the hole. The grooves 425 have a width, which is greater than that of the solder balls 456, to prevent interference with the solder balls 456 to be attached. The projections 428 are formed on the lower surface of the attachment plate 422 at positions, which correspond to the mold caps 452 of the material 450.

As shown in FIG. 5, the eject pins 426 are located in the respective grooves 425 through the holes on the upper surface of the attachment plate 422 at the positions corresponding to the ball lands 454 of the material 450. The eject pins 426 function to convey and drop the solder balls 456 through introduction and removal of vacuum therein and therefrom. In order to prevent interference of the eject pins 426 with the solder balls 456 to be attached, the lower ends of the eject pins 426 are positioned higher than the lower surface of the attachment plate 422. The gap 'a' between the lower end of the eject pin 426 and the lower surface of the attachment plate 422 is 0.1~0.2 mm.

The projection 428 has a height which is determined such that a summed height of the projection 428 and the mold cap 452 formed on the material 450 permits a distance 'b' of 0.02~0.03 mm between the upper end of the solder ball 456 to be attached and the eject pin 426. That is, the projection 428 has a height, which will be proportionally adjusted to the height of the solder ball 456 to maintain the distance 'b'.

Referring to FIG. 6, the holder 420 and the attachment plate 422 has therein a tensioning part 460, which includes a dial gauge 462, such that the tension between the mold caps 452 of the material 450 and the projections 428 of the attachment plate 422 can be constantly maintained when attaching the solder balls 456.

Hereinbelow, a method for attaching solder balls using the ball attaching apparatus 400 in accordance with an embodiment of the present invention will be described with reference to FIGS. 4 through 6.

As shown in the drawings, the material 450 having the plurality of ball lands 454 and the mold caps 452 is loaded and fixed on the indexer 410, which has the material fixing unit 412.

The solder balls 456 to be attached to the ball lands 454 of the material 450 are held in a state in which they are vacuum-sucked to the respective eject pins 426.

The holder 420 is lowered by the driving unit 440, which is installed at the center portion of the holder 420. The projections 428, which are formed on the attachment plate 422, are brought into contact with the mold caps 452 of the material 450, and thereupon, press the mold caps 452 of the material 450 with predetermined tensioning force determined by the tensioning part 460 provided in the holder 420, so that the warpage of the material 450 is corrected. The predetermined tensioning force is set in the dial gauge 462 provided in the tensioning part 460 so that the degree of tension, which is applied by the projections 428 to the mold caps 452, can always be constant.

Therefore, when conducting a ball attaching process, the warpage of the material 450 is corrected, and the entire ball lands 454 of the material 450 can be positioned at the same height, whereby it is possible to precisely attach the solder balls 456 onto the entire ball lands 454.

Then, the vacuum in the eject pins 426 is removed, and the solder balls 456 that were sucked inside the eject pins 426 are dropped precisely onto the respective ball lands 454 of the substrate 450.

As is apparent from the above description according to an embodiment of the present invention, since the projections formed on an attachment plate press the mold caps provided at corresponding positions on a material with a predetermined tensioning force, the warpage of the material is corrected so that the solder balls are attached precisely.

Therefore, the present invention prevents the "missed ball" or the "extra ball" or the "mis-positioned ball" phenomenon occurring during a ball attaching process due to warpage of a substrate, and thereby improves the semiconductor package reliability.

Moreover, as the solder balls are precisely attached to the ball lands of the material according to the present invention, the temporary interruptions caused due to a quality control inspector catching the instances of the imprecisely attached solder balls due to warped substrates can be eliminated by at least 95%. Further, since it is not necessary to pass an FBGA package through external visual inspection (EVI) equipment for inspection of the solder balls, the present invention affords simpler processes.

Although a specific embodiment of the present invention has been described for illustrative purposes, those skilled in the art will appreciate that various modifications, additions and substitutions are possible, without departing from the scope and the spirit of the invention as disclosed in the accompanying claims.

What is claimed is:

1. A ball attaching apparatus for attaching solder balls to a plurality of ball lands on a material, the apparatus comprising:
   an indexer having the material placed thereon, the material having the ball lands and mold caps positioned at intervals between the ball lands;
   a holder located above the indexer, wherein the holder is movable toward or away from the material on the indexer;
   an attachment plate installed on a lower surface of the holder, the attachment plate comprising:
   projections formed at the positions corresponding to the placement of the mold caps on the material; and
   grooves formed with openings at the lower surface of the attachment plate at positions corresponding to the ball lands of the material,
   wherein each groove is capable of accommodating therein all or a part of a solder ball, and
   wherein each groove is formed with one or more holes with openings at the upper surface of the attachment plate; and
   eject pins, each of which is arranged through the hole of a groove toward the inside of the groove of the attachment plate for conveying and dropping solder balls on the ball lands.

2. The apparatus according to claim 1, wherein the holder and the attachment plate further comprises a tensioning part having a dial gauge for adjusting tension between the mold caps of the material and the projections of the attachment plate.

3. The apparatus according to claim 1, wherein a lower end of the eject pin is positioned higher than a lower surface of the attachment plate.

4. The apparatus according to claim 3, wherein the lower end of the eject pin is positioned higher than the lower surface of the attachment plate by 0.1~0.2 mm.

5. The apparatus according to claim 1, wherein the projection has a height which is determined such that a summed height of the projection and the mold cap formed on the material permits a distance of 0.02~0.03 mm between an upper end of the solder ball to be attached and the eject pin.

6. The apparatus according to claim 5, wherein the projection has a height which is proportional to that of the solder ball to be attached such that the distance between an upper end of the solder ball and the lower end of the eject pin is 0.02~0.03 mm.

7. The apparatus according to claim 1, wherein the groove has a width which is greater than that of the solder ball to be attached.

8. The apparatus according to claim 1, wherein the material comprises a substrate.

9. The apparatus according to claim 1, wherein the indexer has material fixing unit for securely holding the material on the indexer using vacuum.

10. The apparatus according to claim 1, wherein the holder has a stopper for adjusting a height of the holder.

11. The apparatus according to claim 1, wherein the holder further has a driving unit for controlling raising and lowering of the holder.

12. A method of attaching solder balls using a ball attaching apparatus comprising:
an indexer having a material thereon where the material has the ball lands and mold caps positioned at intervals between the ball lands;
a movable holder located above the indexer;
an attachment plate installed on a lower surface of the holder, the attachment plate comprising:
projections formed at the positions corresponding to the placement of the mold caps on the material; and
grooves formed with openings at the lower surface of the attachment placte at positions corresponding to a plurality of ball lands of the material,
wherein each groove is capable of accommodating all or a part of a solder ball, and
wherein each groove is formed with one or more holes with openings at the upper surface of the attachment plate; and
eject pins, each of which is arranged through the hole of a groove toward the inside of the groove of the attachment plate for conveying and dropping solder balls on the ball lands, the method comprising the steps of:

placing the material on the indexer, the material having a plurality of ball lands and the mold caps placed at intervals with respect to the ball lands;
lowering the holder by which the projections formed on the attachment plate are brought into contact with the mold caps of the material until the warpage of the material is sufficiently corrected by pressing the mold caps; and
attaching the solder balls to the ball lands on the material by removing vacuum in the eject pins.

13. The method according to claim 12, wherein, in the step of bringing the attachment plate into contact with the mold caps of the material, a gap between the eject pin and the material is constantly maintained by a pressure applied to the mold caps by a tensioning part which includes the attachment plate and a dial gauge disposed in the holder.

14. The method according to claim 13, wherein a lower end of the eject pin is positioned higher than a lower surface of the attachment plate.

15. The method according to claim 14, wherein the lower end of the eject pin is positioned higher than the lower surface of the attachment plate by 0.1~0.2 mm.

16. The method according to claim 12, wherein the projection has a height which is determined such that a summed height of the projection and the mold cap formed on the material permits a distance of 0.02~0.03 mm between an upper end of the solder ball to be attached and the eject pin.

17. The method according to claim 16, wherein the projection has a height which is proportional to that of the solder ball which is attached such that a distance between an upper end of the solder ball and the eject pin is 0.02~0.03 mm.

18. The method according to claim 12, wherein the groove has a width which is greater than that of the solder ball to be attached.

19. The method according to claim 12, wherein the material comprises a substrate.

20. The method according to claim 12, wherein the indexer has material fixing unit for fixing the material using vacuum.

21. The method according to claim 12, wherein the holder has a stopper for adjusting a height of the holder.

22. The method according to claim 12, wherein the holder further has a driving unit for controlling raising and lowering of the holder.

* * * * *